(12) United States Patent
Gao

(10) Patent No.: US 10,939,580 B2
(45) Date of Patent: Mar. 2, 2021

(54) CONTROL STRATEGY FOR IMMERSION COOLING SYSTEM

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 58 days.

(21) Appl. No.: 16/363,237

(22) Filed: Mar. 25, 2019

(65) Prior Publication Data

US 2020/0315059 A1    Oct. 1, 2020

(51) Int. Cl.
*H05K 7/20* (2006.01)
*G06F 1/20* (2006.01)

(52) U.S. Cl.
CPC ......... *H05K 7/20236* (2013.01); *G06F 1/206* (2013.01); *G06F 2200/201* (2013.01)

(58) Field of Classification Search
CPC ............ H05K 7/20763; H05K 7/2029; H05K 1/0201; H05K 7/20209; H05K 7/203; H05K 7/20381; H05K 7/20836; G06F 1/20; G06F 1/206
See application file for complete search history.

(56) References Cited

U.S. PATENT DOCUMENTS

| 2009/0268404 | A1* | 10/2009 | Chu | H05K 7/20836 361/696 |
| 2013/0333865 | A1* | 12/2013 | Goth | H05K 7/20836 165/104.31 |
| 2014/0146467 | A1* | 5/2014 | Campbell | H05K 7/20318 361/679.53 |
| 2017/0325355 | A1* | 11/2017 | Lau | H05K 7/20318 |
| 2018/0288906 | A1* | 10/2018 | Hopton | H05K 7/20245 |

\* cited by examiner

*Primary Examiner* — Kidest Bahta
(74) *Attorney, Agent, or Firm* — Womble Bond Dickinson (US) LLP

(57) ABSTRACT

In one embodiment, a method for operating and controlling an immersion cooling system in a normal operating mode includes obtaining sensor data of fluid within an immersion tank of the immersion cooling system, wherein the sensor data includes temperature values of the fluid and fluid level values of the fluid, obtaining temperature values of at least one electronic device immersed in the fluid of the immersion tank, determining if the temperature values are within a required range of temperature values, and if the temperature values are not within the required range of temperature values, determining if the temperature values are higher than the required range. The method further includes, if the temperature values are higher than the required range, increasing a return pump speed of the immersion cooling system. Methods for operating and controlling an immersion cooling system also include control strategies for initial installation and maximum cooling conditions.

20 Claims, 8 Drawing Sheets

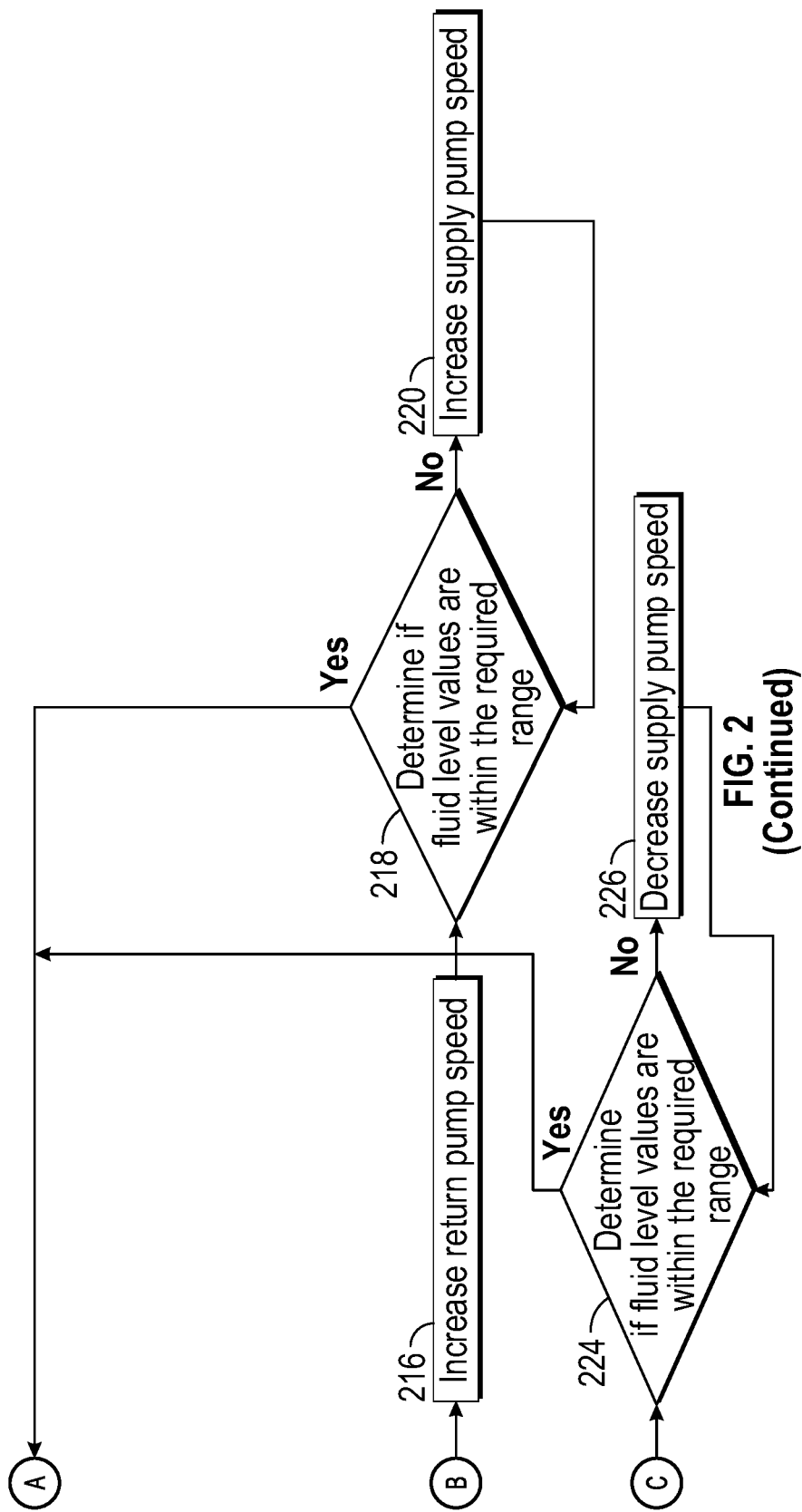

CONTROL STRATEGY FOR IMMERSION COOLING SYSTEM

TECHNICAL FIELD

Embodiments of the present disclosure relate generally to cooling systems for information technology equipment. More particularly, embodiments of the disclosure relate to operating an immersion cooling system.

BACKGROUND

Immersion cooling is an emerging technology and method for high-power density thermal management. With the increasing of power density (thermal design power) of the processors such as central processing units (CPUs) and graphics processing units (GPUs), thermal management of these devices becomes a challenge. It becomes more challenging when multiple high-density processors are packaged in one system (e.g., one server). Traditional air cooling solutions using either heat sink or heat pipe may not be able to satisfy the cooling requirement in these scenarios.

The fluid amount and fluid dynamics control are important for immersion cooling. The amount of the fluid within the immersion tank should be controlled within the designed levels during all operating scenarios. The fluid flow rate and temperature should be very well controlled during all operating scenarios. Therefore, control strategy design is important for an immersion cooling system for high energy efficiency, high reliability, and safe operating conditions.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Figure 1:
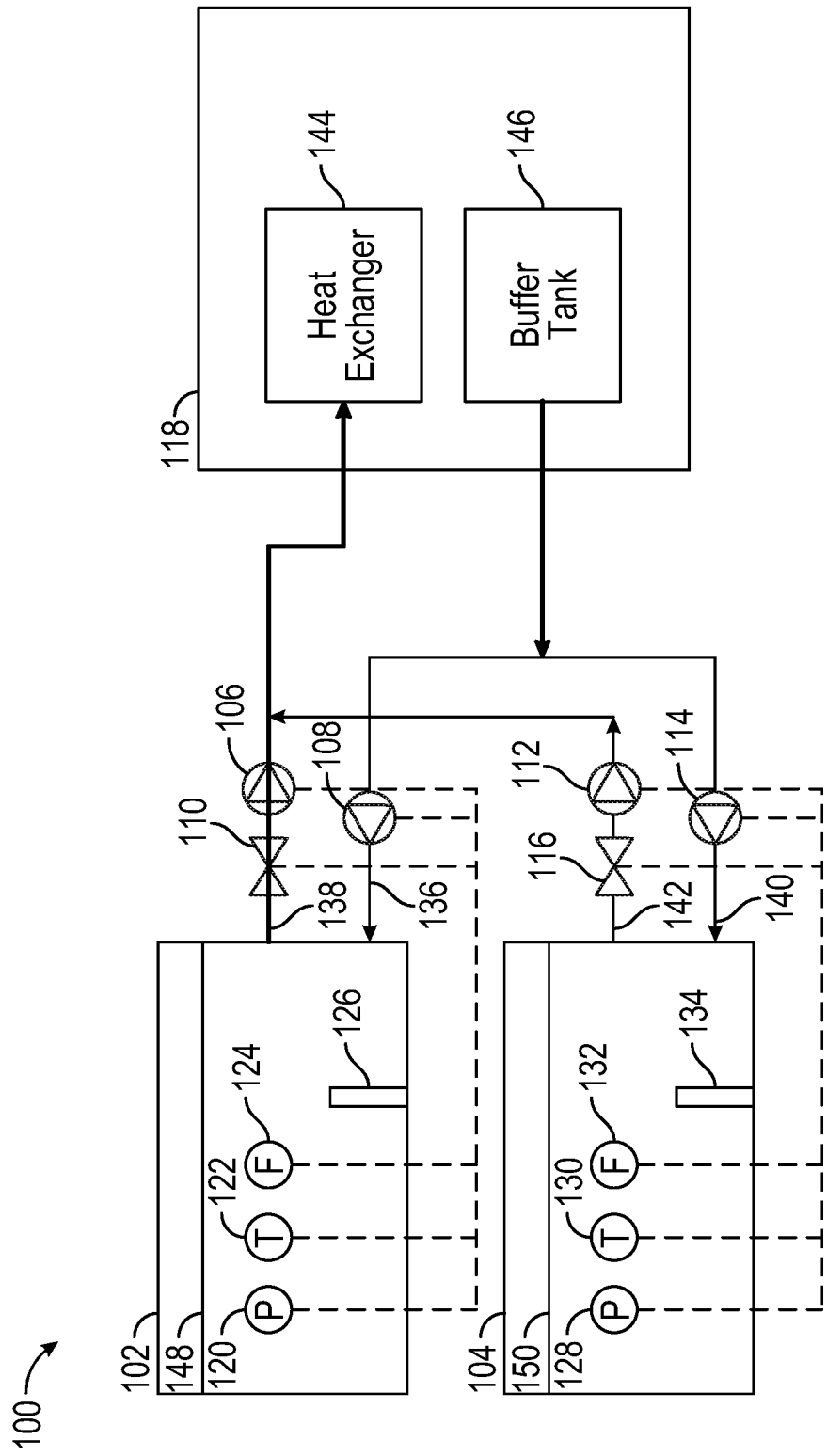
FIG. 1 is a block diagram illustrating an example of an immersion cooling system according to one embodiment.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

According to one embodiment, a method for operating an immersion cooling system in a normal operating mode includes obtaining sensor data of fluid within an immersion tank of the immersion cooling system, wherein the sensor data includes temperature values of the fluid and fluid level values of the fluid, obtaining temperature values of at least one electronic device immersed in the fluid of the immersion tank, determining if the temperature values are within a required range of temperature values or higher than a first predetermined temperature value, and if the temperature values are not within the required range of temperature values or higher than the first predetermined temperature value, increasing a return pump speed of the immersion cooling system to increase fluid flow rate within the immersion loop. In addition, if the temperature values are lower than a second predetermined temperature value, the pump speed may be decreased.

According to another embodiment, a method for operating an immersion cooling system in an initial installation and system refilling mode includes obtaining sensor data of fluid within an immersion tank of the immersion cooling system, wherein the sensor data includes fluid level values of the fluid, determining if the fluid level values are within a required range and if the fluid level value are not within the required range, determining if the fluid level values are higher than the required range. The method further includes if the fluid level values are higher than the required range, increasing the return pump speed of the immersion cooling system, and if the fluid level values are not higher than the required range, increasing the supply pump speed of the immersion cooling system.

According to another embodiment, a method for operating an immersion cooling system in a maximum cooling mode includes obtaining sensor data of fluid within an immersion tank of the immersion cooling system, wherein the sensor data includes fluid level values of the fluid, determining if a maximum cooling condition of the immersion cooling system is needed, and determining if the fluid level values are within a required range if the maximum cooling condition is needed. The method further includes operating the immersion cooling system at a normal operating control mode if the maximum cooling condition is not needed.

According to one aspect of the present disclosure, control strategies for an immersion cooling system are disclosed for controlling an immersion cooling loop which is used between an immersion tank and an external cooling loop. The control strategies ("control system") manage the fluid dynamics inside the immersion tank for system management under different scenarios, including normal operating mode, maximum cooling mode, and initial installation and system refilling mode. The control system requires installing multiple types of sensors including one or more pressure sensors, one or more temperature sensors and one or more fluid level sensors to collect immersion tank fluid condition information. The immersion tank fluid condition information is used for controlling the hydraulic hardware including pumps and valves to control the thermal environment dynamics and fluid dynamics inside the immersion tank.

Advantageously, aspects of the present disclosure provide improved system reliabilities, better fluid management, higher energy efficiency, and a robust control solution for an immersion cooling system. In addition, the control system can be adapted in different types of immersion cooling systems such as different immersion tank design, different immersion supply and return loop design, (internal loop design), and different types of external loop design (for example, it may or may not include a coolant distribution unit (CDU) and it may or may not include a system level immersion fluid buffer tank). Furthermore, aspects of the present disclosure provide for adaptability for different types of IT equipment and a higher safety level.

The control system uses multiple sensors including one or more pressure sensors, one or more temperature sensors and one or more fluid level sensors. The control system is used to control the fluid flow rate and pressure recirculating within the immersion cooling loop and tank to ensure proper fluid level and fluid pressure, and temperature conditions.

FIG. 1 shows an example of an immersion cooling system 100 according to one embodiment. It can be seen that multiple (e.g., two) immersion tanks 102, 104 are connected to CDU 118 via respective supply and return loops. In other embodiments, a single immersion tank may be connected to a CDU or more than two tanks may be connected to the CDU. CDU 118 includes a heat exchanger 144 for extracting heat from the cooling fluid and a buffer tank 146 which is used for storing the cooling fluid ("immersion fluid"). A suitable immersion fluid may be a thermally-conductive dielectric liquid. In this example, each immersion tank supply and return loops are not forming a closed loop. In these scenarios, the individual immersion tank and loop control are important.

Continuing with FIG. 1, immersion tank ("tank") 102 is connected to CDU 118 via a supply loop 136 including a supply pump 108 and a return loop 138 including a valve 110 for controlling the flow rate and a return pump 106 (In one embodiment, the valve and the pump may provide similar function such as regulating and controlling the fluid and, in one embodiment, only a pump is needed and no valve is needed). Immersion tank 102 includes a cooling fluid having a fluid level 148, a pressure sensor 120, a temperature sensor 122, a fluid level sensor 124, and one or more electronic devices 126 submerged in the internal cooling fluid. The pressure sensor 120, temperature sensor 122, fluid sensor 124, pumps (106, 108) and valve 110 may all be controlled by a suitable controller (not shown), the control being represented by the dashed lines as shown in FIG. 1. In one embodiment, multiple pressure, temperature, and fluid level sensors may be used in the tank 102. Examples of one or more electronic devices 126 may be one or more server blades submerged in the internal cooling liquid. Each server blade includes one or more information technology (IT) components (e.g., processors, memory, storage devices).

In like manner, immersion tank 104 is connected to CDU 118 via a supply loop 140 including a supply pump 114 and a return loop 142 including a valve 116 for controlling the flow rate and a return pump 112. Immersion tank 104 includes a cooling fluid having a fluid level 150, a pressure sensor 128, a temperature sensor 130, a fluid level sensor 132, and one or more electronic devices 134 submerged in the internal cooling fluid. The pressure sensor 128, temperature sensor 130, fluid sensor 132, pumps (112, 114) and valve 116 may all be controlled by a suitable controller (not shown), the control being represented by the dashed lines as shown in FIG. 1. A separate controller may be used to control each tank or a single controller may be used to control multiple tanks. In one embodiment, multiple pressure, temperature, and fluid level sensors may be used in the tank 104. Examples of one or more electronic devices 134 may be information technology (IT) equipment such as one or more server blades submerged in the internal cooling liquid. Each server blade includes one or more IT components (e.g., processors, memory, storage devices).

Pressure sensors 120, 128 are used to monitor the fluid static pressure at designed locations. Temperature sensors 122, 130 are used to monitor the fluid temperature at designed locations. Fluid level sensors 124, 132 are used to monitor the fluid level within each respective tank. The cooling fluid is recirculating between the immersion tank (e.g., tank 102) and external cooling system (e.g., CDU 118). The cooling fluid is supplied to the immersion tank at certain temperature and flow rate. The heat generated by the IT components is extracted to the fluid, and the fluid leaves the immersion tank flowing to the external cooling system. The fluid pumps and valves are used to control the fluid flow rate and pressure. In addition, the pumps and valves are used together to control the total amount of fluid inside the tank, or the fluid level within the tank, as well as fluid flow rate.

For multiple types of immersion cooling tank designs, fluid management strategies may be different for each design. This means that the fluid dynamics are different. The locations of the above described sensors are different in each tank in different designs. In one embodiment, the fluid level sensors (e.g., fluid level sensors 124, 132) are used to monitor the fluid level within each tank in which the fluid level is the total amount of the fluid within the tank. The fluid level is varied in multiple scenarios such as when different amount of the IT equipment is installed inside the tank and different types of IT equipment are installed.

For IT equipment thermal management, the important parameters are fluid temperature and flow rate. The pressure sensors are used to monitor the fluid static pressure at the IT equipment inlet and outlet or some other locations, and the temperature sensors are used to monitor the inlet fluid temperature to the IT equipment. Certain parameters are defined as follows.

Initial total amount of fluid within the tank: $Q_{initial}$;
Amount of fluid delivered by the supply loop: $Q_{supply}$;
Amount of fluid extracted to the return loop: $Q_{return}$;
Total amount of the fluid during a dynamic condition: $Q_{tank}$;

Then $Q_{tank} = Q_{initial} + Q_{supply} - Q_{return}$. (1)

By adjusting the supply pump (e.g., supply pump 114), $Q_{supply}$ is adjusted and by adjusting the return pump (e.g., return pump 112) and valve (e.g., valve 116), $Q_{return}$ is adjusted.

In terms of the fluid management within the immersion tank and the immersion fluid cooling loop, two of the parameters are the amount of the fluid within the tank and the fluid flow rate. In Eq. (1) above, $Q_{supply}$ and $Q_{return}$ are adjusted and controlled by the supply and return pumps, respectively. Depending on the amount of $Q_{initial}$, the pumps are adjusted to make sure $Q_{tank}$ is within the design range. When $Q_{supply}$ and/or $Q_{return}$ change, the control system is used to maintain $Q_{tank}$ within the design range. Even though both the pumps are identical, the $Q_{supply}$ and $Q_{return}$ are not necessarily identical due to the fact that their corresponding loops' fluid resistance may be different. When the fluid flow rate within the immersion tank needs to adjusted, the control system needs to make sure the proper fluid flow rate is provided, and the amount of the fluid within the tank stays within the design range.

Each of the processes described below with reference to FIGS. 2-4 may be implemented using the immersion cooling system 100 shown in FIG. 1 and described above. In addition, each process may be performed by processing logic which may include software, hardware, or a combination thereof. For example, each process described below may be performed in part by a controller described above in which the controller may include a processor and memory for storing suitable instructions for execution by the processor.

Figure 2:
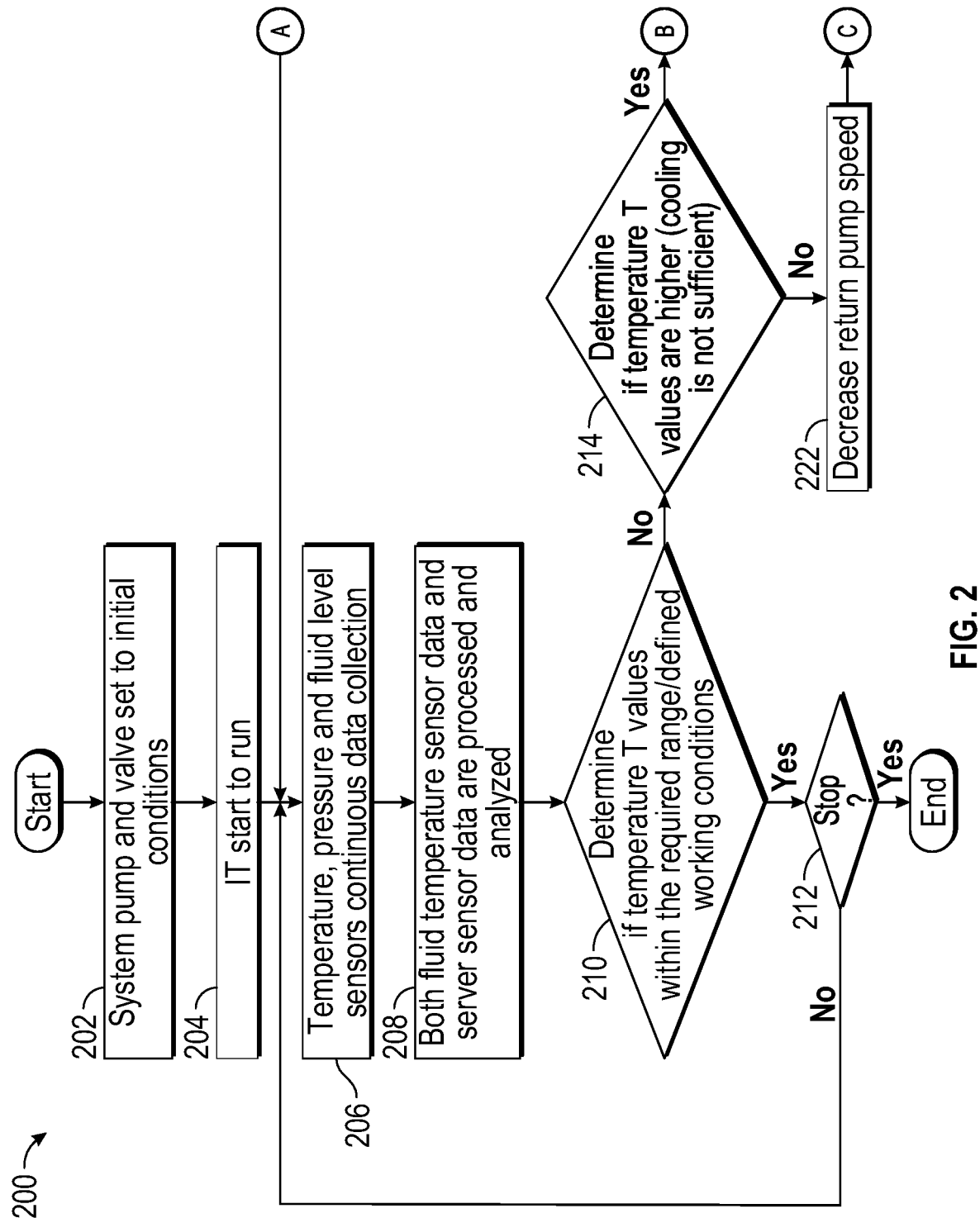
FIG. 2 is a flow diagram of a process of operating an immersion cooling system in a normal operating mode according to one embodiment.

FIG. 2 is a flow diagram of a process of operating an immersion cooling system in a normal operating mode according to one embodiment. During a normal operating mode, the fluid flow rate (e.g., 1 liter/minute) may need to be adjusted due to changes in the load or variations in the external cooling conditions (this can be understood as the variations in immersion cooling fluid supply temperature). In these scenarios, the fluid flow rate needs to be adjusted. In the immersion cooling fluid loop, the fluid flow rate in the supply loop, return loop as well as the corresponding fluid flow rate within the tank can be different since they may not form a closed loop. Therefore, when adjusting the pumps to achieve the corresponding fluid flow rate within the tank, the fluid amount within the tank needs to be carefully controlled. FIG. 2 shows the control logic diagram representing the control logic for these scenarios. When a tank is populated with different IT equipment (which means the fluid resistance is different), a control strategy is need to provide proper fluid flow rate.

Continuing with FIG. 2, process 200 includes in operation 202, setting the system pumps and valve(s) to initial conditions, in operation 204, the IT equipment starts to run, and in operation 206, obtaining or collecting sensor data of at least one parameter (e.g., temperature, fluid level, pressure) of the fluid within an immersion tank (e.g., immersion tank 102) of the immersion cooling system (e.g., immersion cooling system 100), wherein the sensor data includes temperature values of the fluid and fluid level values of the fluid. Pressure values are also obtained in addition to the temperature and fluid level values in a continuous data collection operation. Process 200 further includes in operation 208, obtaining temperature values of one or more electronic devices (e.g., server blade(s)) immersed in the fluid of the immersion tank (e.g., both fluid temperature sensor data and server blade sensor data are processed and analyzed), in operation 210, determining if the temperature values are within a required range of temperature values. The required range of temperature values may vary depending on various factors including system design and operation, IT equipment used in the system, the source of the temperature values, the fluid level, and the fluid amount. For example, if the source of the temperature values is the fluid temperature, the required range may be one suitable range. Alternatively, if the source of the temperature values is the one or more electronic devices, the required range may be a different (e.g., higher) suitable range of temperatures, such as chip case temperature or junction temperature. In one embodiment, temperature sensors embedded in the one or more electronic devices may be used to collect temperature values of each electronic device. In one example, the immersion tank (e.g., immersion tank 102) may be initially filled with a suitable amount of the cooling fluid. If the temperature values are not within the required range of temperature values ("No") in operation 210, the process 200 further includes in operation 214, determining if the temperature values are higher than the required range, and if the temperature values are higher than the required range ("yes"), in operation 216, increasing a return pump speed (e.g., return pump 106) of the immersion cooling system. The process 200 further includes in operation 218, after increasing the return pump speed, determining if the fluid level values of the fluid in the immersion tank are within a required range of fluid level values, and if the fluid level values are not within the required range of fluid level values ("No"), in operation 220, increasing a supply pump speed (e.g., supply pump 108) of the immersion cooling system. The required range of fluid level values is dependent on various factors such as the tank design, actual application scenarios, and the number and type of electronic devices immersed in the tank for cooling. The basic requirement is that the IT equipment should be fully submerged within the immersion fluid, and fully contained within the tank at any conditions. The process 200 further includes, if the fluid level values are within the required range of fluid level values ("yes") in operation 218, returning to operation 206 to continue to obtain sensor data of the fluid in the immersion tank.

The process 200 further includes, if the temperature values are not higher than the required range ("No) in operation 214, in operation 222, decreasing the return pump speed of the immersion cooling system (e.g., for energy efficient operation). The process 200 further includes, after decreasing the return pump speed, in operation 224, determining if the fluid level values of the fluid in the immersion tank are within a required range of fluid level values, and if the fluid level values are not within the required range of fluid level values ("No"), in operation 226, decreasing a supply pump speed of the immersion cooling system. The process 200 further includes, if the fluid level values are within the required range of fluid level values ("yes") in operation 224, returning to operation 206 to continue to obtain sensor data of the fluid in the immersion tank. The process 200 further includes, if the output of operation 210 is "yes," determining whether to stop and if the decision is "No," returning to operation 206, and if the decision is "yes," process ends.

A temperature range may include a higher threshold and a low threshold. In one embodiment, if the temperature of the fluid and/or the electronic devices is higher than the high threshold of the temperature range, the liquid flowrate needs to be increased in order to bring the temperature down, for example, by increasing the pump speed of the supply and/or return pumps. Similarly, when the temperature is lower than the low threshold of the temperature range, the flowrate of the liquid may be decreased, for example, by lowering the pump speed of the supply and/or return pumps (to save power).

In one embodiment, if the fluid level is higher than a high threshold of the fluid level range, the flowrate may be lowed, for example, by reducing the pump speed of the supply and/or increasing pump speed of the return pumps, as well as the valves disposed on the supply line and/or return line of the fluid. Similarly, if the fluid level is below a low threshold of the fluid level range, the flowrate of the fluid may be increased, for example, by increasing the pump speed of a supply pump or reducing the pump speed of the return pump. The same or similar logic flow may also be applied to pressure sensor data to maintain a proper range of the fluid pressure within the immersion tank. One of the purposes of the control system is to maintain the temperature, fluid level, and fluid pressure within a respective proper range.

Figure 3:
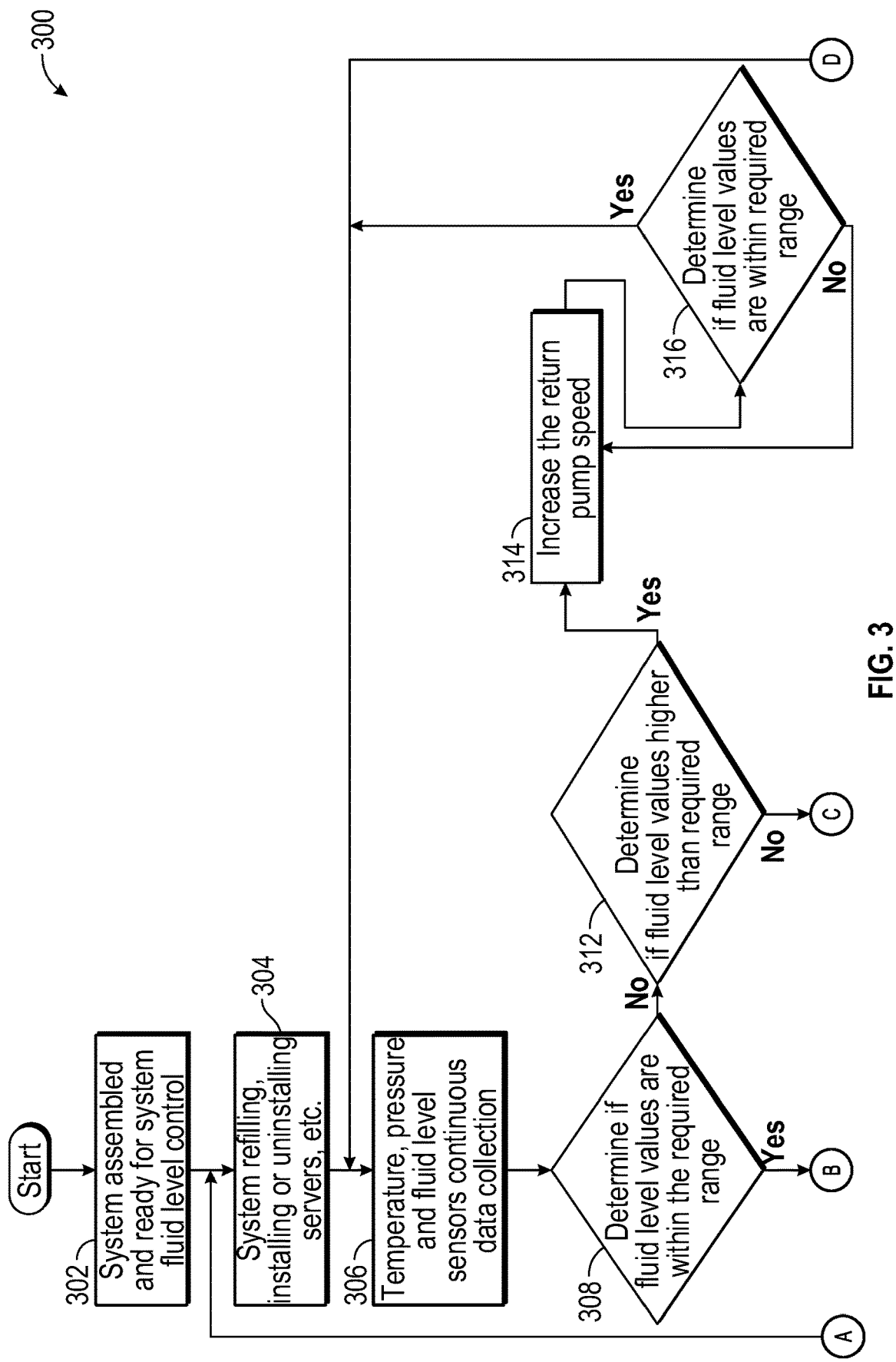
FIG. 3 is a flow diagram of a process of operating an immersion cooling system in an initial installation and system refilling mode according to one embodiment.
Figure 3:
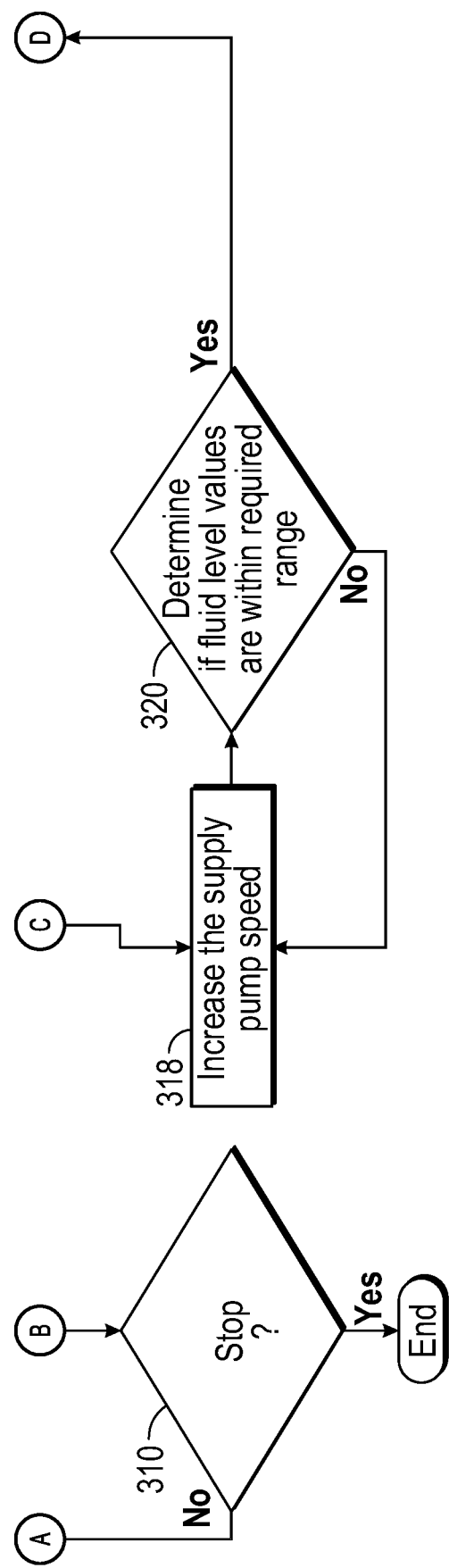

FIG. 3 is a flow diagram of a process 300 of operating an immersion cooling system in an initial installation and system refilling mode according to one embodiment. In these scenarios, the amount of the fluid within the tank $Q_{tank}$ is important. During the initial installation or system refilling, the fluid amount needs to be controlled and fast deployment and quick filling are also needed. During regular maintenance and service, such as server maintenance or service, the system fluid rate and fluid level will be impacted. In these scenarios, system fluid level control is important. The pressure sensor(s) are used for monitoring the fluid amount within the tank.

Continuing with FIG. 3, process 300 includes in operation 302, system is assembled and ready for system fluid level control, in operation 304, system refilling, installing, or uninstalling servers, server blades or other IT equipment and in operation 306, obtaining sensor data of at least one parameter (e.g., temperature, fluid level, pressure) of a fluid within an immersion tank (e.g., immersion tank 102) of the immersion cooling system (e.g., immersion cooling system 100), wherein the sensor data includes fluid level values of the fluid, temperature values of the fluid, and pressure values of the fluid in a continuous data collection. Process 300 further includes in operation 308, determining if the fluid level values are within a required range, and if the fluid level value are not within the required range ("No"), in operation 312, determining if the fluid level values are higher than the required ("design") range. The required range of fluid level values is dependent on various factors such as the tank design, actual application scenarios, and the number and type of electronic devices immersed in the tank for cooling. Process 300 further includes if the fluid level values are higher than the required range ("Yes"), in operation 314, increasing the return pump speed (e.g., return pump 106) of the immersion cooling system, and if the fluid level values are not higher than the required range ("No"), in operation 318, increasing the supply pump speed (e.g., supply pump 108) of the immersion cooling system.

Continuing with FIG. 3, process 300 further includes after increasing the return pump speed, in operation 316, determining if the fluid level values are within the required range, and if the fluid level values are not within the required range ("No"), increasing again the return pump speed. Process 300 further includes if the fluid level values are within the required range ("Yes") in operation 316, returning to operation 306 to continue to obtain sensor data of the fluid in the immersion tank. Process 300 further includes after increasing the supply pump speed, in operation 320, determining if the fluid level values are within the required range and if the fluid level values are within the required range ("Yes"), returning to operation 306 to continue to obtain sensor data of the fluid in the immersion tank, and if the fluid level values are not within the required range ("No"), increasing again the supply pump speed. Process 300 further includes if the fluid level values are within the required range in operation 308 ("Yes"), in operation 310, determining whether or not to stop the process and if the decision is "No," returning to operation 304 and if the decision is "Yes," ending the process. Again, one of the purposes of the control system is to maintain the temperature, fluid level, and fluid pressure within a respective proper range.

Figure 4:
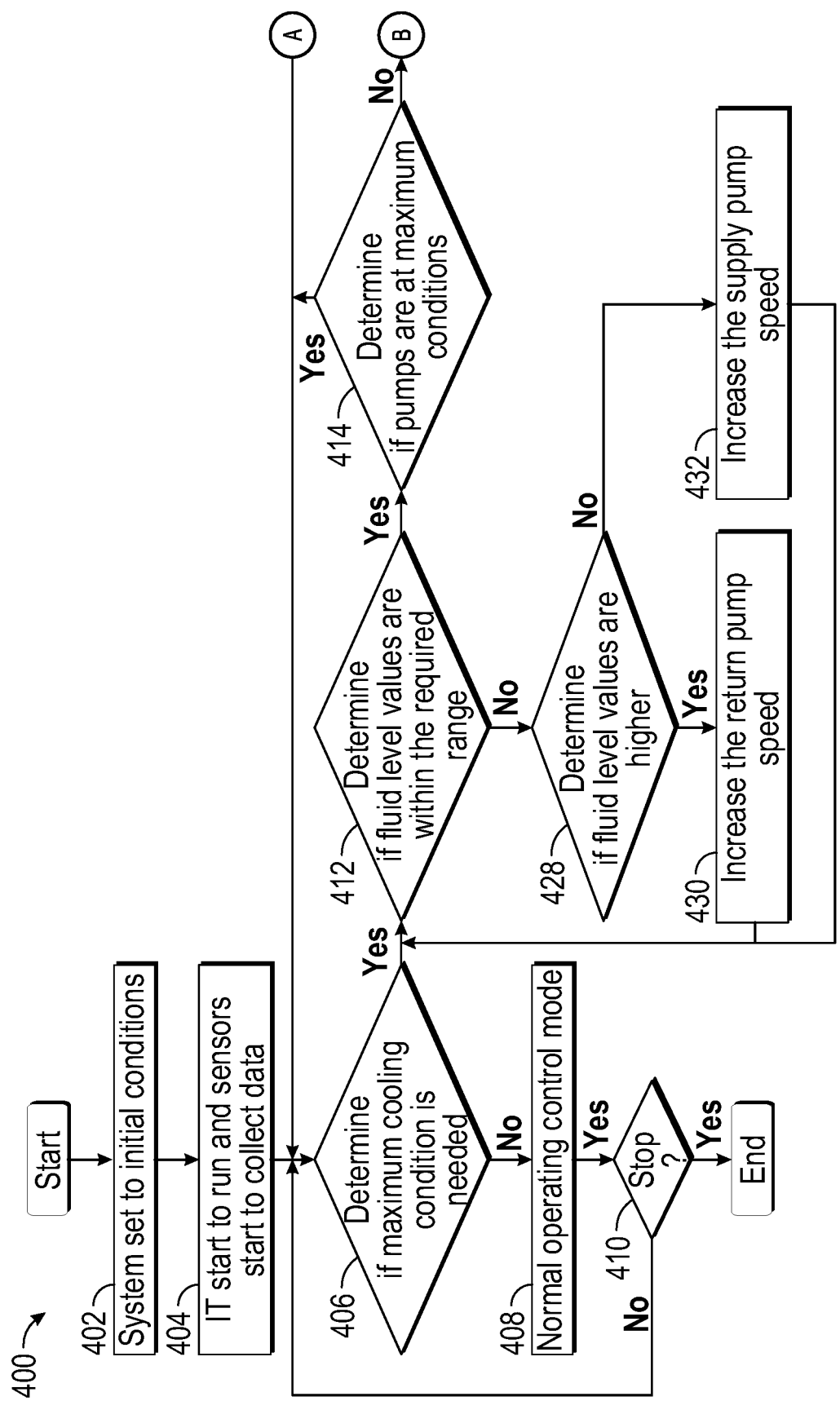
FIG. 4 is a flow diagram of a process of operating an immersion cooling system in a maximum cooling mode according to one embodiment.
Figure 4:
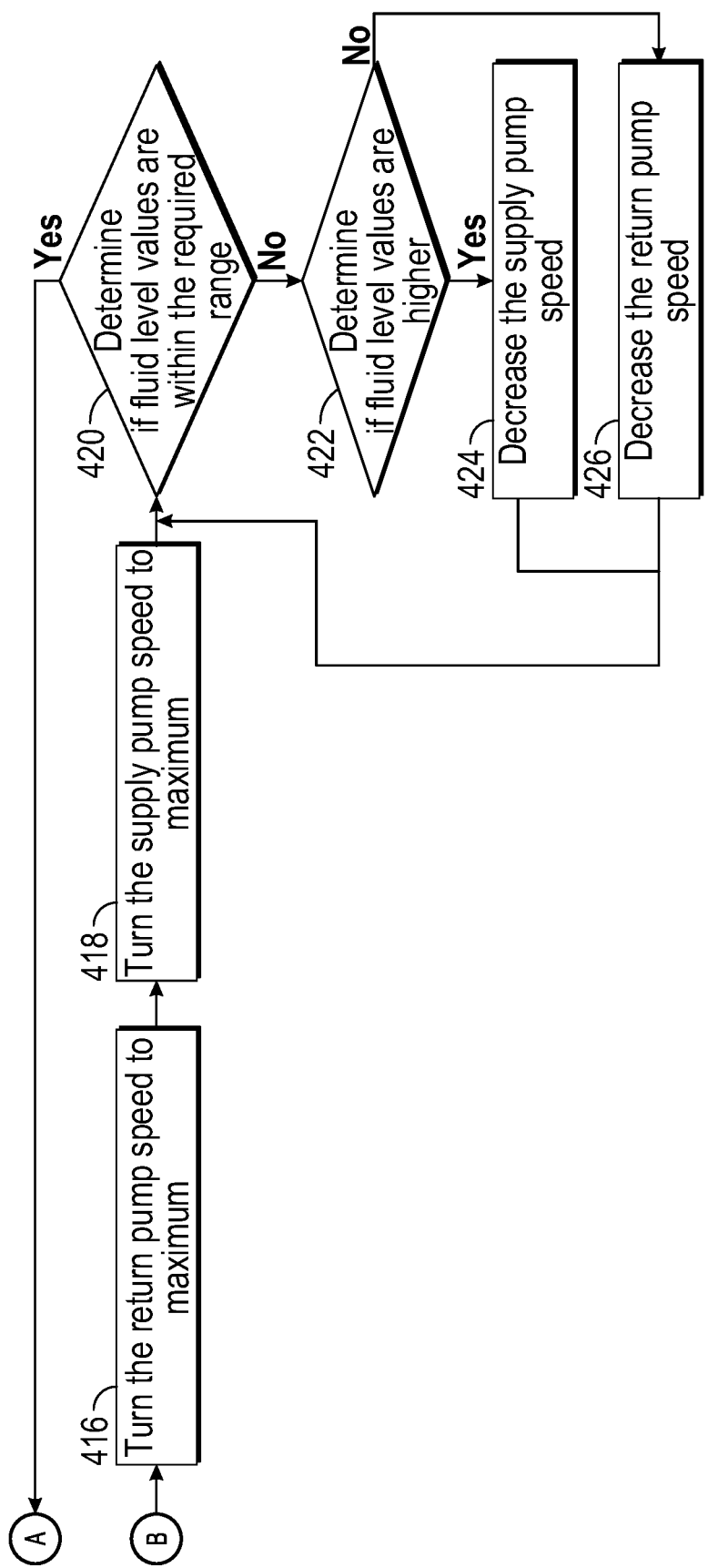

FIG. 4 is a flow diagram of a process 400 of operating an immersion cooling system in a maximum cooling mode according to one embodiment. In terms of a maximum cooling mode, the pumps are set to maximum speed. In this scenario, the amount of the fluid accepted within the tank as well as the amount of the total fluid needs to be controlled. Process 400 includes in operation 402, setting the immersion cooling system to initial conditions, in operation 404, IT equipment within an immersion tank (e.g., immersion tank 102) starts to run and sensors (e.g., sensors 120, 122, 124) start to collect data by obtaining sensor data of at least one parameter (e.g., temperature, fluid level, pressure) of the fluid within the immersion tank of the immersion cooling system, wherein the sensor data includes fluid level values of the fluid, temperature values of the fluid, and pressure values of the fluid. Process 400 further includes in operation 406, determining if a maximum cooling condition of the immersion cooling system is needed and in operation 412, determining if the fluid level values are within a required range if the maximum cooling condition is needed ("Yes") and in operation 408, operating the immersion cooling system at a normal operating control mode if the maximum cooling condition is not needed ("No"). The required range of fluid level values is dependent on various factors such as the tank design, actual application scenarios, and the number and type of electronic devices immersed in the tank for cooling. In operation 410, a determination is made whether or not to stop the process and if the decision is "No," process returns to operation 406 and if the decision is "Yes," process ends.

Continuing with FIG. 4, process 400 further includes if the fluid level values are within the required range in operation 412 ("Yes"), in operation 414, determining if a supply pump and a return pump of the immersion cooling system are operating at a maximum condition, and if the supply and return pumps are not operating at a maximum condition ("No"), in operations 416 and 418 increasing ("turn") the supply and return pump speeds to a maximum speed, wherein the supply (e.g., supply pump 108) and return (e.g., return pump 106) pumps are connected to the immersion tank 102. Process 400 further includes after increasing the supply and return pump speeds to the maximum speed, in operation 420, determining if the fluid level values are within the required range, and if the fluid level values are within the required range ("Yes"), returning to operation 406 to determine if the maximum cooling condition of the immersion cooling system is needed. If the fluid level values are not within the required range in operation 420 ("No"), in operation 422, determining if the fluid level values are higher than the required range, and if the fluid level values are not higher than the required range ("No"), in operation 426, decreasing the return pump speed, and if the fluid level values are higher than the required range in operation 422 ("Yes"), in operation 424, decreasing the supply pump speed. Process 400 further includes if the fluid level values are not within the required range in operation 412 ("No"), in operation 428, determining if the fluid level values are higher than the required range, and if the fluid level values are higher than the required range ("Yes"), in operation 430, increasing the return pump speed and if the fluid level values are not higher than the required range ("No"), in operation 432, increasing the supply pump speed.

The valve 110 and 116 and return pump 106 may be used in different ways in different scenarios. In some cases, the valve may not be a necessary unit. In some cases, the valve and return pump may provide similar function. In some cases, the valve may be used as a emergent shut down valve. In some cases, the valve may be used on the supply loop. In the above descriptions, the control is designed for controlling the valve, but similar control strategy can be used for the valve, resulting in similar functions.

Control strategy for special scenarios: During the pump failure scenarios (e.g., either the supply or return pump), the control strategy will shut down both pumps and close the valve also. During the external cooling source failure scenario, the system is adjusted to maximum cooling control scenario.

Figure 5:
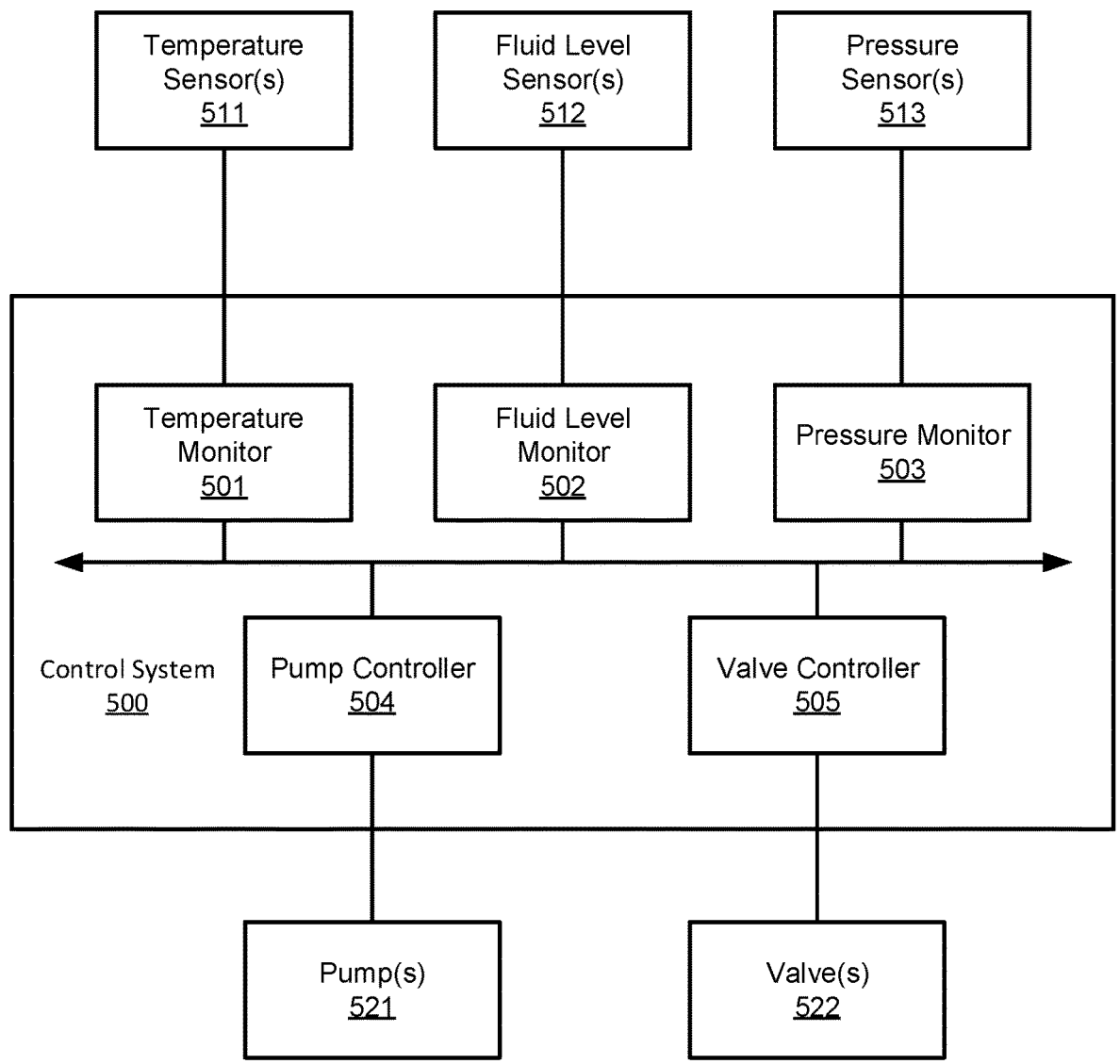
FIG. 5 is a block diagram illustrating an example of a control system according to one embodiment.

FIG. 5 is a block diagram illustrating an example of a control system according to one embodiment. Referring to FIG. 5, control system 500 (also referred to as controller)

may be coupled to any of the sensors, pumps, and valves as described above. In one embodiment, control system 500 includes a temperature monitor 501, a fluid level monitor 502, and pressure monitor 503 to monitor and receive sensor data from temperature sensors 511, fluid level sensors 512, and pressure sensors 513 respectively. Based on the sensor data, according to a set of cooling control rules (not shown), pump controller 504 and valve controller 505 are configured to control a supply pump, a return pump, and a valve, which in turn control the fluid flowrate of the immersion tank, as described above. Note that control system 500 may be coupled to a single immersion tank (e.g., one control system per immersion tank). Alternatively, control system 500 may be coupled to multiple immersion tanks to control the temperatures of the immersion tanks.

A computer-readable storage medium may also be used to store the software functionalities (e.g., instructions) described above persistently. While computer-readable storage medium is, in an exemplary embodiment, a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media, or any other non-transitory machine-readable medium.

Processing ("processor") module/unit/logic components and other features described herein can be implemented as discrete hardware components or integrated in the functionality of hardware components such as ASICS, FPGAs, DSPs or similar devices. In addition, processing module/unit/logic can be implemented as firmware or functional circuitry within hardware devices. Further, processing module/unit/ logic can be implemented in any combination hardware devices and software components.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially. Machine learning techniques may be applied to the control strategies for system optimization.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A computer-implemented method for operating an immersion cooling system, comprising:
   obtaining sensor data of at least one parameter of a fluid within an immersion tank of the immersion cooling system, wherein the sensor data includes a first temperature value representing a temperature of the fluid;
   obtaining a second temperature value representing a temperature of at least one electronic device submerged in the fluid of the immersion tank;
   determining whether the first and second temperature values are higher than a first predetermined temperature value; and
   increasing a return pump speed of the immersion cooling system, if the first and second temperature values are higher than the first predetermined temperature value.

2. The method of claim 1, further comprising:
   obtaining a fluid level value representing a level of the fluid within the immersion tank;
   determining whether the fluid level value of the fluid in the immersion tank is below a first predetermined fluid level; and
   increasing a supply pump speed of the immersion cooling system, in response to determining that the fluid level value is below the first predetermined fluid level.

3. The method of claim 2, further comprising:
   determining whether the fluid level value of the fluid is above a second predetermined fluid value; and
   decreasing the supply pump speed of the immersion cooling system, in response to determining that the fluid level is above the second predetermined fluid level.

4. The method of claim 1, further comprising:
   determining whether the first and second temperature values are below a second predetermined temperature value; and
   decreasing the return pump speed of the immersion cooling system, if the first and second temperature values are below the second predetermined temperature value.

5. The method of claim 4, further comprising:
   obtaining a fluid level value representing a level of the fluid within the immersion tank;
   after decreasing the return pump speed, determining if the fluid level value of the fluid in the immersion tank are within a predetermined range of fluid level values; and
   if the fluid level values are not within the required range of fluid level values, decreasing a supply pump speed of the immersion cooling system.

6. The method of claim 5, further comprising:
   if the fluid level value is within the predetermined range of fluid level values, continuing to obtain sensor data of the fluid in the immersion tank.

7. The method of claim 1, further comprising:
   obtaining a pressure value of the fluid using a pressure sensor in the immersion tank; and
   adjusting a fluid flowrate of the immersion tank based on the pressure value.

8. A computer-implemented method for operating an immersion cooling system, comprising:
- obtaining sensor data of at least one parameter of a fluid within an immersion tank of the immersion cooling system, wherein the sensor data includes one or more fluid level values of the fluid representing a level of the fluid within the immersion tank;
- determining whether the fluid level values are higher than a first predetermined fluid level;
- increasing the return pump speed of the immersion cooling system, if the fluid level values are higher than the predetermined fluid level;
- determining whether the fluid level values are lower than a second predetermined fluid level; and
- increasing the supply pump speed of the immersion cooling system, in response to determining that the fluid level values are lower than the second predetermined fluid level.

9. The method of claim 8, wherein the sensor data includes a temperature value representing a temperature of the fluid or an electronic device submerged in the fluid.

10. The method of claim 9, further comprising:
- determining whether the temperature value is within a predetermined temperature range; and
- adjusting a fluid flowrate in response to determining that the temperature value is outside of the predetermined temperature range.

11. The method of claim 9, wherein the sensor data includes a pressure value of the fluid representing an amount of fluid within the immersion tank.

12. The method of claim 11, further comprising:
- determining whether the pressure value is within a predetermined pressure range; and
- adjusting a fluid flowrate of the fluid, in response to determining that the pressure value is outside of the predetermined pressure range.

13. The method of claim 12, wherein adjusting a fluid flowrate of the fluid comprises adjusting a valve disposed on a fluid supply line or a fluid return line of the immersion tank.

14. A computer-implemented method for operating an immersion cooling system, comprising:
- obtaining sensor data of at least one parameter of a fluid within an immersion tank of the immersion cooling system, wherein the sensor data includes one or more fluid level values of the fluid;
- determining if a maximum cooling condition of the immersion cooling system is needed;
- determining if the fluid level values are within a required range, in response to determining that the maximum cooling condition is needed; and
- operating the immersion cooling system at a normal operating control mode if the maximum cooling condition is not needed.

15. The method of claim 14, further comprising:
- if the fluid level values are within the required range, determining if a supply pump and a return pump of the immersion cooling system are operating at a maximum condition; and
- if the supply and return pumps are not operating at the maximum condition, increasing the supply and return pump speeds to a maximum speed, wherein the supply and return pumps are connected to the immersion tank.

16. The method of claim 15, further comprising:
- after increasing the supply and return pump speeds to the maximum speed, determining if the fluid level values are within the required range; and
- if the fluid level values are within the required range, determining if the maximum cooling condition of the immersion cooling system is needed.

17. The method of claim 16, further comprising:
- if the fluid level values are not within the required range, determining if the fluid level values are higher than the required range; and
- if the fluid level values are not higher than the required range, decreasing the return pump speed.

18. The method of claim 17, further comprising:
- if the fluid level values are higher than the required range, decreasing the supply pump speed.

19. The method of claim 14, further comprising:
- if the fluid level values are not within the required range, determining if the fluid level values are higher than the required range; and
- if the fluid level values are higher than the required range, increasing the return pump speed.

20. The method of claim 19, further comprising:
- if the fluid level values are not higher than the required range, increasing the supply pump speed.

* * * * *